United States Patent
Cannizzaro et al.

[11] Patent Number: 5,930,601
[45] Date of Patent: Jul. 27, 1999

[54] HEAT ASSEMBLY AND METHOD OF TRANSFERRING HEAT

[75] Inventors: Sharon M. Cannizzaro, Roswell; Libbie R. Terwilliger, Lilburn; Timothy B. Tunnel, Lawrenceville; Wayne P. Vaughn, Lilburn, all of Ga.; Steven Veneman, Port Deposit, Md.

[73] Assignee: Scientific-Atlanta, Inc., Norcross, Ga.

[21] Appl. No.: 08/898,240

[22] Filed: Jul. 22, 1997

Related U.S. Application Data

[62] Division of application No. 08/705,609, Aug. 30, 1996, Pat. No. 5,739,586.

[51] Int. Cl.⁶ .......................... H01L 21/44; H01L 21/48; H01L 21/50
[52] U.S. Cl. ..................... 438/122; 438/106; 438/121
[58] Field of Search ....................... 438/122, 121, 438/106

[56] References Cited

U.S. PATENT DOCUMENTS

| | | |
|---|---|---|
| 4,731,701 | 3/1988 | Kuo et al. . |
| 4,942,076 | 7/1990 | Panicker et al. . |
| 5,219,794 | 6/1993 | Satoh et al. ............................ 438/126 |
| 5,268,048 | 12/1993 | Leibovitz et al. . |
| 5,300,459 | 4/1994 | Ushikubo et al. ...................... 438/126 |
| 5,305,186 | 4/1994 | Appelt et al. . |
| 5,307,237 | 4/1994 | Walz . |
| 5,311,060 | 5/1994 | Rostoker et al. . |
| 5,325,265 | 6/1994 | Turlik et al. . |
| 5,339,519 | 8/1994 | Fortune . |
| 5,543,663 | 8/1996 | Takubo . |
| 5,639,696 | 6/1997 | Liang et al. ............................ 438/125 |
| 5,763,296 | 6/1998 | Casati et al. ........................... 438/123 |

OTHER PUBLICATIONS

Alexander Ehnert, et al. "A New Surface Mount Power Package", *IEEE Applied Power Electronic Conference, APEC '93*, Mar. 7–11, 1993, pp. 380–384.

*Primary Examiner*—Kevin M. Picardat
*Assistant Examiner*—Deven Collins
*Attorney, Agent, or Firm*—Kenneth M. Massaroni; Kelly A. Gardner; Hubert J. Barnhardt III

[57] ABSTRACT

A heat sink assembly includes a printed wiring board, a metal case and a circuit package containing a gallium arsenide field effect transistor heat dissipating circuit. The circuit package includes a metal slug formed integrally with the circuit package, the heat dissipating circuit being bonded to an obverse surface of the metal slug. The printed wiring board includes first and second metal lands, the first metal land being disposed on an obverse surface of the printed wiring board, the second metal land being disposed on a reverse surface of the printed wiring board. A solder film is formed bonded to and thermally coupling a reverse surface of the metal slug to the first metal land, and a plurality of solder posts are formed, each post bonding to and thermally coupling the first metal land to the second metal land. The metal case is pressed against the second metal land with a grease film of thermally conductive grease squeezed therebetween. At least one bolt extends through a hole in the printed wiring board and into the metal case so as to squeeze together the metal case, the printed wiring board, the first and second metal lands and the grease film.

22 Claims, 3 Drawing Sheets

HEAT ASSEMBLY AND METHOD OF TRANSFERRING HEAT

This application is a division of application Ser. No. 08/705,609, filed Aug. 30, 1996 now U.S. Pat. No. 5,739,586.

BACKGROUND OF THE INVENTION

1. Field of the Invention

The present invention relates to a heat sink assembly for a cable television line amplifier. In particular, the invention relates to a heat sink assembly to transfer heat from a GaAs FET amplifier integrated circuit to a metal case housing a printed wiring board on which the amplifier integrated circuit is mounted.

2. Description Of Related Art

Heat dissipating surface mount technology has been described. For example, see "A New Surface Mount Power Package" by Alexander Ehnert and Jean-Luc Diot, published in the Proceedings of I.E.E.E. Applied Power Electronics Conference, APEC '93, conference date Mar. 7–11, 1993, incorporated herein by reference. However, Ehnert and Diot describe using copper filled through holes, and do not describe using solder posts formed in a reflow solder operation. Furthermore, Ehnert and Diot do not disclose mounting a gallium arsenide integrated circuit amplifier for wide band usage in the package. This is significant in that wide band gallium arsenide integrated circuit amplifiers as described herein dissipate more heat than do comparable sized power semiconductors, thus requiring improved thermal conduction to a cold sink.

U.S. Pat. No. 4,942,076 to Panicker, et al. describes a ceramic substrate with metal filled via holes for hybrid microcircuits. Panicker et al describe a high frequency gallium arsenide die mounted on a ceramic substrate with via holes that use metal filings to carry its internally generated heat through the ceramic to a heat sink.

However, Panicker et al. do not describe a microcircuit package with a heat slug bonded to a land of a printed wiring board.

SUMMARY OF THE INVENTION

It is an object to the present invention to provide for efficient heat transfer from a gallium arsenide field effect transistor amplifier integrated circuit to a casing housing a printed wiring board on which is mounted the integrated circuit amplifier. It is a further object of the present invention to provide this heat transfer assembly using inexpensive mass production technology. It is yet another object to provide thermal coupling between the integrated circuit amplifier package and the printed wiring board using reflow solder processing techniques.

These and other objects are achieved in a heat sink assembly that includes a printed wiring board, a metal case and a circuit package containing a gallium arsenide field effect transistor heat dissipating circuit. The circuit package includes a metal slug formed integrally with the circuit package, the heat dissipating circuit being bonded to an obverse surface of the metal slug. The printed wiring board includes first and second metal lands, the first metal land being disposed on an obverse surface of the printed wiring board, the second metal land being disposed on a reverse surface of the printed wiring board. A solder film is formed bonded to and thermally coupling a reverse surface of the metal slug to the first metal land, and a plurality of solder posts are formed, each post bonding to and thermally coupling the first metal land to the second metal land. The metal case is pressed against the second metal land with a grease film of thermally conductive grease squeezed therebetween. At least one bolt extends through a hole in the printed wiring board and into the metal case so as to squeeze together the metal case, the printed wiring board, the first and second metal lands and the grease film.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Improvements in line amplifiers used in cable television distribution systems have enabled wide band operation to provide subscribers with an increased number of channels. To achieve high performance, wide band operation, gallium arsenide field effect transistor integrated circuit amplifiers are being used. See U.S. patent application Ser. No. 08/686,022, "FIELD EFFECT TRANSISTOR CABLE TELEVISION LINE AMPLIFIER", filed Jul. 25, 1996, incorporating herein by reference. These wide band amplifiers suffer from greater heat dissipation in the amplifier circuit itself than more narrow band counterparts. When greater heat dissipation is encountered with conventional heat sink assemblies, the active transistors are forced to operate at elevated temperatures. Temperature elevation of an active transistor by as much as 20° C. has been shown to reduce the life of the transistor by half. In order to achieve a longer life amplifier, it is necessary to improve the heat transfer assembly.

Figure 1:
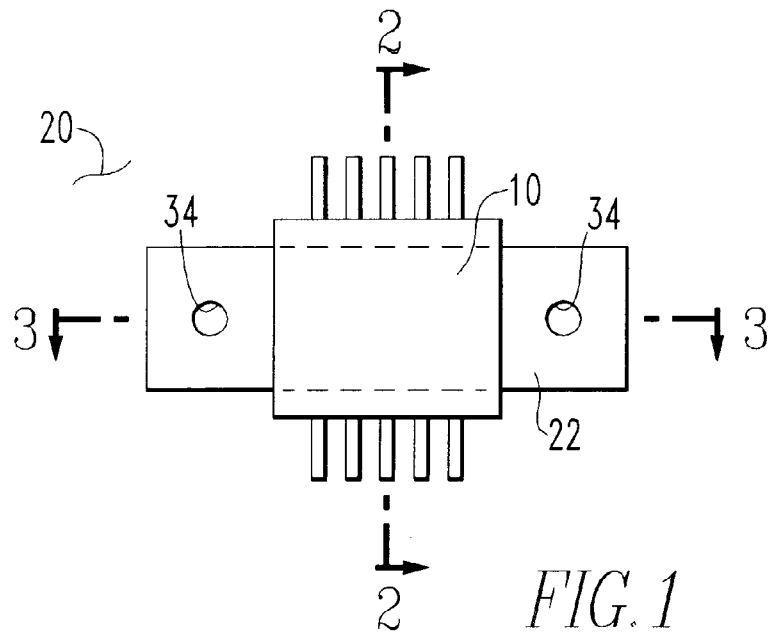
FIG. 1 is a plan view of a top of a heat sink assembly.

In FIG. 1, circuit package 10 is mounted on circuit board 20. Circuit board 20 may be a multi layer printed wiring board or a two-sided wiring board. Such printed wiring boards are formed of a substrate that has copper cladding on at least their obverse and reverse surfaces. The copper cladding is etched to leave the circuit wiring desired, ground planes, and in the present application, thermally conductive lands 22. A hole for a bolt is drilled in the printed wiring board at 34. The boards are prepared for component mounting, for example, by tin plating.

Figure 2:
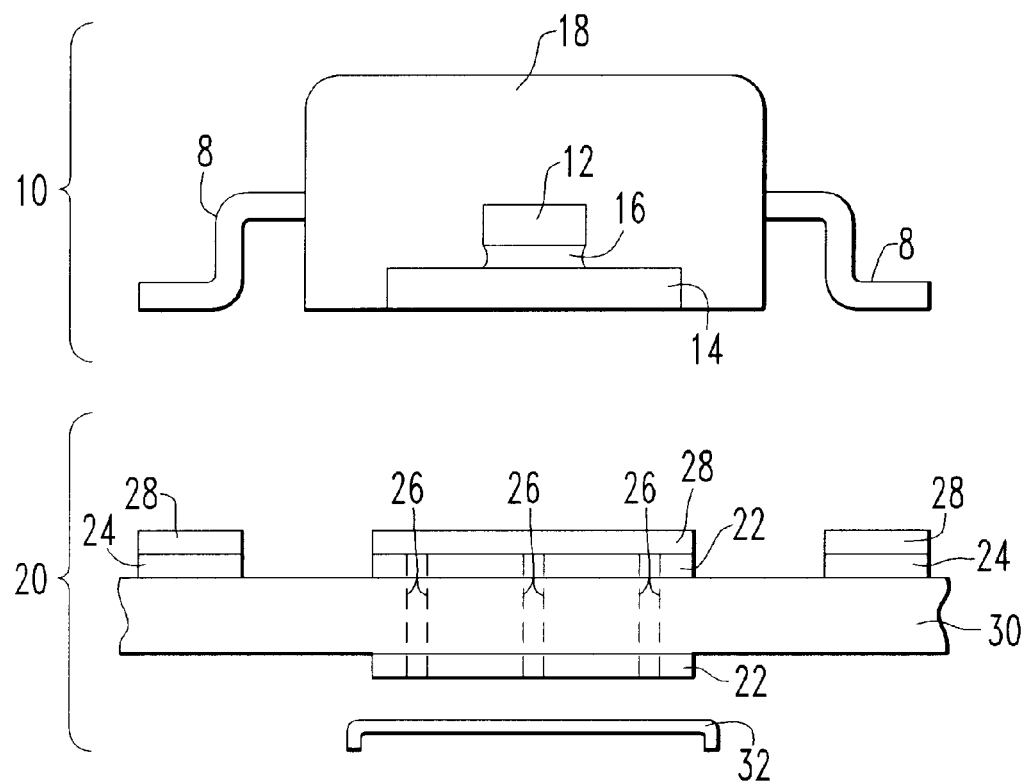
FIG. 2 is a section view of a circuit package and circuit board of the heat sink assembly.

FIG. 2 is a section view of section 2—2 of FIG. 1. In FIG. 2, circuit package 10 includes heat dissipating circuit 12, for example, a high heat dissipation gallium arsenide field effect amplifier integrated circuit. Circuit package 10 further includes heat slug 14. Preferably heat slug 14 is formed from tin plated copper. Integrated circuit amplifier 12 is eutecticly bonded to heat slug 14 through eutectic bond 16. Preferably eutectic bond 16 employs a brazing (or soldering) alloy that melts at a temperature sufficiently above the temperature of lead tin solder that subsequent soldering operations do not remelt bond 16. Case 18 encloses amplifier integrated circuit 12 and heat slug 14 and is formed of materials selected for other properties (for example, plastic selected for a hermetic seal). Case 18 is preferably formed of plastic. Leads 8 extend out of circuit package 10. Circuit board 20 includes substrate 30 preferably formed of epoxy-fiberglass or FR4. Substrate 30 has disposed thereon lands 22 on opposite surfaces of substrate 30. Pads 24 are also formed on a surface of substrate 30. Pads 24 and lands 22 are formed out of a copper sheet (e.g., 0.001 or 0.002 inches of copper) clad to substrate 30 by patterning and etching.

In the present invention, via holes 26 are drilled through lands 22 and substrate 30. Via holes 26 are preferably plated through holes. Subsequently, tape 32 (preferably Kaptont™ tape) is applied to land 22 on the reverse side of substrate to hold solder in via hole 26 during subsequent reflow and wave solder operations.

Solder paste 28 is screened (e.g., like silk screening) onto land 22 and pads 24 on the obverse side of substrate 30 to a prescribed thickness using a solder paste stenciling machine. The solder paste is preferably a paste comprised of 10% rosin flux and 90% finely powdered solder. The solder is preferably a eutectic blend composed of 62% tin, 36% lead, and 2% silver.

Circuit package 10 is then mounted on circuit board 20, preferably using a surface mount placement machine.

Circuit board 20 with mounted circuit package 10 is then passed through an infra red heat reflow oven, typically 215° C. for 60 seconds. In this oven, the rosin and solder of the solder paste melt and flow. Solder paste 28 over pads 24 becomes solder that bond leads 8 to corresponding pads 24. Solder paste 28 over land 22 becomes solder that bonds heat slug 14 to land 22, and furthermore, flows solder into via holes 26 to form solder posts bonded to and thermally coupling land 22 on the obverse surface of substrate 30 to land 22 on the reverse surface of substrate 30.

The printed wiring board may also mount components that are through-hole mounted. In this case, the components are mounted, either by hand or by machine, and the assembled printed wiring board is wave soldered in a wave soldering machine, typically 260° C. for 10 seconds.

Next, tape 32 is removed.

Figure 3:
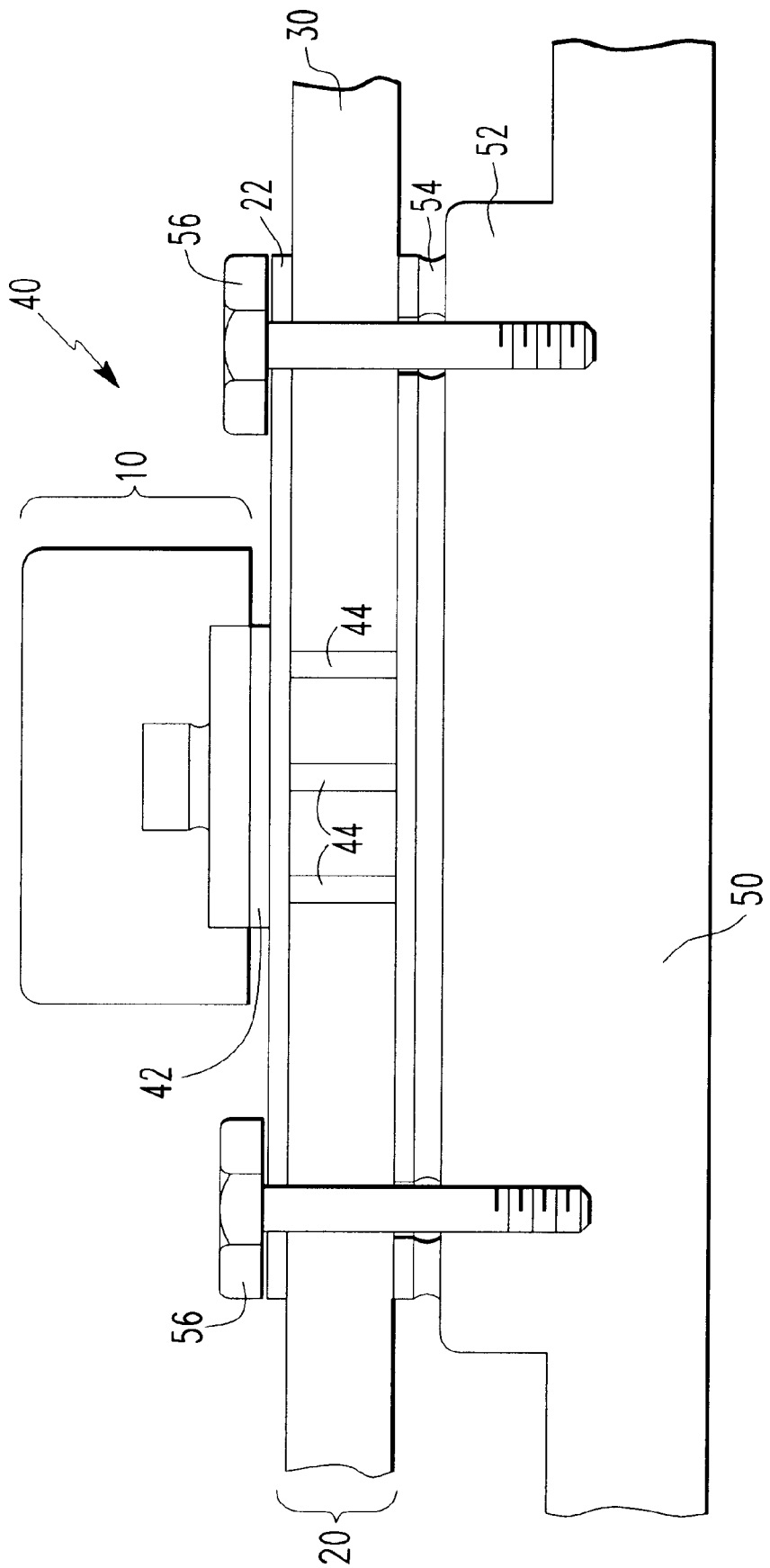
FIG. 3 is a section view of the completed heat sink assembly.

FIG. 3 depicts the improved heat sink assembly with circuit board 20 (and circuit package 10 mounted thereon) installed in metal case 50. Metal case 50 is preferably a complete case enveloping circuit board 20. Shown in FIG. 3, is a portion of metal case 50 having a protrusion 52. Protrusion 52 is preferably flat so as to efficiently and thermally confront land 22 on the reverse side of substrate 30. The assembly is formed by applying thermally conductive grease 54 onto the flat portion of protrusion 52. Thermally conductive grease 54 is preferably a silicon grease with a high concentration of zinc (or beryllium) oxide dispersed therein. Circuit board 20 is installed in case 50 so that land 22 on the reverse surface of substrate 30 squeezes the thermally conductive grease 54. Bolts 56 are installed through bolt holes 34 (FIG. 1) in circuit board 20 and into the protrusion portion 52 of metal case 50. As the bolts are tightened, excess grease is squeezed out of the gap between protrusion portion 52 and land 22 on the reverse side of substrate 30. Preferably, the grease is thermally squeezed out except for voids and pores in the materials so that protrusion 52 directly contacts land 22 in much of the area.

Metal case 50 is preferably formed from diecast aluminum using 380 alloy.

Studies have been conducted to determine the optimal size of via holes, the hole-to-hole spacing in the grid of via holes, the thickness and area of solder paste 28 (FIG. 2) so as to define total solder volume, the area of and dimensions of heat slug 14, and the area and dimensions of lands 22. It is desired to completely fill the via holes with a solder post, and at the same time bond the heat slug 14 to the land 22 with a thermally conductive solder film, and at the same time bond one end of solder post 44 to land 22 on the reverse side of substrate 30, and at the same time bond the solder post to the plated metal sleeve in the via hole.

Heat slug 14 preferably measures 0.138 inches by 0.344 inches. The larger the heat slug, the greater is the difficulty of manufacturing circuit package 10. For example, a large heat slug may tend to develop cracks in the body of circuit package 10 when processed to produce the heat sink assembly described herein. On the other hand, a large heat sink is desired to provide a good thermal coupling between heat slug 14 and land 22 on the obverse surface of substrate 30.

The quality of the thermal coupling and bond between heat slug 14 and land 22 on the obverse surface of substrate 30 is adversely effected by a rough surface on the bottom of heat slug 14. The bottom of heat slug 14 should be co-planar to within 0.007 inches, preferably within 0.004 inches.

The process of stenciling deposits solder paste onto lands 22 and pads 24. The thickness of the solder pastes should be between 7.32 and 15.29 thousandths of an inch, preferably between 10 and 12 thousandths of an inch. Preferably, this thickness is defined by an optimal thickness for bonding lead 8 to pad 24 (and other bonded leads).

However, sufficient solder is needed to flow into and fill via holes 26. To achieve sufficient solder, the area of land 22 on the obverse surface of substrate 30 is made larger than the area of heat slug 14, preferably 40% larger in area. The opening in the stencil through which solder paste 28 is deposited is preferably adjusted so that the area of solder paste 28 over land 22 on the obverse surface of substrate 30 is about 50% larger than the area of heat slug 14.

Each via hole is preferably a plated through hole. During the process of fabricating the printed wiring board, copper plating forms a copper sleeve inside the hole. Preferably the whole copper clad board is tin plated to avoid oxidation of copper.

A via hole may be considered "filled" if upon examination there is at least 75% of the hole's cross section area filled with solder. The solder flows into the plated through hole so as to form a superior thermal path from the bottom surface of heat slug 14 through the solder post and into the plated copper sleeve inside the plated through hole. Heat flows through both the solder post and the plated copper sleeve into land 22 on the reverse surface of substrate 30. Heat in the plated copper sleeve efficiently flows to land 22 on the reverse side of substrate 30. The solder posts as described herein bond to the plated copper sleeve so that as much as 63% of the heat from slug 14 flows through the plated copper sleeve, and only 37% of the heat must pass through the solder post, to reach land 22 on the reverse surface of substrate 30.

In the area of heat slug 14 (that measures 0.138 inches by 0.344 inches), there are preferably 28 via holes evenly distributed (e.g., about 0.040 inches on centers). The via holes should be between 0.012 and 0.022 inches in diameter, preferably 0.016 inches in diameter.

Solder paste 28 first begins to melt and fill the via holes in the reflow oven and then completes filling the via holes when the printed wiring board is processed through the wave solder machine (in which the printed wiring board with components thereon is "floated" on a pool of molten solder). This process uses standard reflow solder steps and wave solder steps (i.e., process steps optimized for surface mount of components in the reflow oven and through hole mount of components in the wave solder process). Special adjustments are not needed to affect this heat sink.

The solder posts formed in the via holes are bonded to the bottom surface of heat slug 14. A measure of this bond is the shear force required to break off circuit package 10. A good solder joint would have a theoretical optimum shear strength of about 8,000 pounds per square inch. The shear strength of the solder joints in the grid of solder posts should average to be about half of this theoretical optimum shear strength (e.g., 4,000 pounds per square inch). Tests were performed, and it was confirmed that the posts achieved shear strength over 4,000 pounds per square inch. In some tests, the fiberglass in substrate 30 broke before the bond between solder posts and heat slug 14, and in other tests, the casing around circuit package 10 cracked before the bond between solder posts and heat slug 14.

Figure 4:
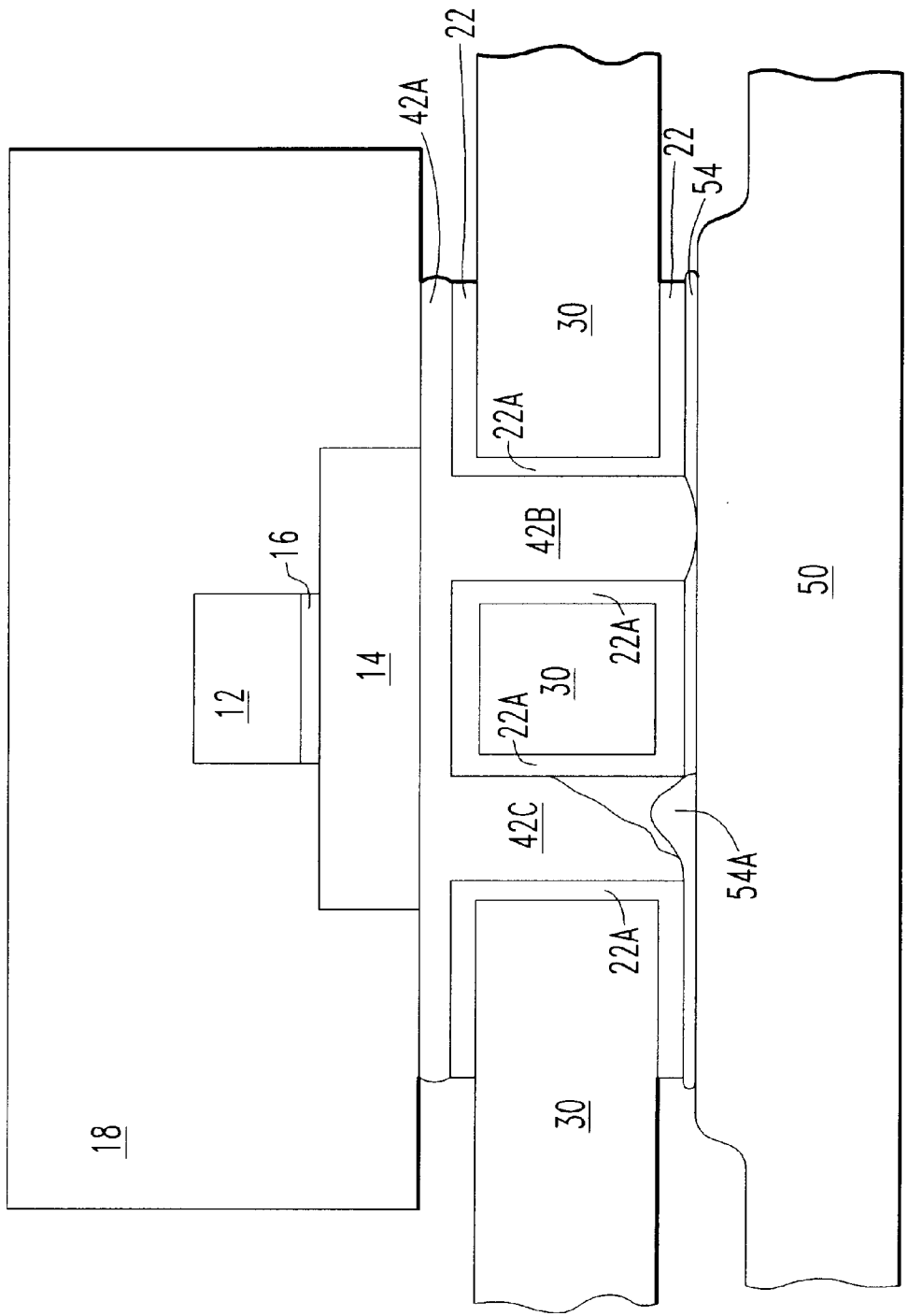
FIG. 4 is a detail section view of a portion of the section of FIG. 3.

FIG. 4 is a detailed section view corresponding to FIG. 3. In FIG. 4, lands 22 on the obverse and reverse sides of substrate 30 are connected with plated metal sleeves 22A. Plated metal sleeves 22A are preferably formed as plated through via holes when substrate 30 and lands 22 are formed. Plated metal sleeves 22A are preferably formed of copper metal and then protected from oxidation with a thin tin plating. The process of forming plated metal sleeves 22A is preferably carried out using known plated through hole techniques compatible with plated through hole requirements of remaining portions of the printed wiring board.

The thickness and area of solder paste 28 defines the volume of solder of the solder body. The solder body forms thin solder film 42A and a plurality of solder posts represented as 42B, 42C. Solder film 42A bonds metal slug 14 to metal land 22 on the obverse surface of substrate 30, and conducts heat from metal slug 14 to metal land 22. Solder post 42B preferably fills plated metal sleeve 22A so that solder post 42B extends to and bonds with metal land 22 on the reverse surface of substrate 30, and solder post 42B conducts heat from metal slug 14 to metal land on the reverse surface of substrate 30.

On occasion, it may happen that a solder post such as solder post 42C does not completely fill metal sleeve 22A. However, even in such a situation, solder post 42C bonds with metal sleeve 22A. Solder post 42C conducts heat from metal slug 14 to metal sleeve 22A, and metal sleeve 22A, in turn, conducts heat to metal land 22 on the reverse surface of substrate 30. The void in metal sleeve 22A left by the incompletely formed solder post 42C is filled by a small portion 54A of thermal grease 54.

With this arrangement, a direct heat conductive path extends from heat dissipating circuit 12 through eutectic bond 16, through metal slug 14, through solder body having film 42A and posts 42B, 42C, through metal lands 22 and plated metal sleeves 22A, through thermal conductive grease 54 and into metal case or chassis 50. Bolts 56 (FIG. 3) squeeze most of grease 54, except for void that are filled, from between land 22 and metal case 50. Thus, the thermal path from heat dissipating circuit 12 to metal case 50 conducts heat through metals, not ceramics, not fiberglass, etc. Thus, improved heat transfer performance is achieved using conventional reflow and wave soldering operations. When metal case 50 is maintained at 100° C. and heat dissipating circuit 12 dissipates 6.2 W in an environmental air temperature of 60° C., the heat slug temperature rises no more than 22° C., typically 9° C.

Having described preferred embodiments of a novel heat sink assembly and method of transferring heat (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims:

What is claimed is:

1. A method of transferring heat from a heat dissipating circuit comprising steps of:
   conducting heat from the heat dissipating circuit to a metal slug through a eutectic bond;
   conducting heat from the metal slug through a solder body having a plurality of solder posts into a corresponding plurality metal sleeves disposed in a corresponding plurality of via holes through a substrate; and
   conducting heat from the plurality of metal sleeves into a metal land clad to a reverse surface of the substrate.

2. The method of claim 1, further comprising a step of conducting heat from the metal land through a thermally conductive grease to a metal case.

3. The method of claim 1, further comprising a step of further conducting heat from the metal slug through the solder posts into the metal land.

4. The method of claim 1, further comprising steps of:
   further conducting heat from the metal slug through a solder film of the solder body into another metal land clad to an obverse surface of the substrate; and
   conducting heat from said another metal land through a bolt into a metal case.

5. A method of forming a heat transfer assembly comprising steps of:
   forming a printed wiring board to include first and second metal lands and a plurality of via holes extending through the first and second metal lands;
   applying a piece of tape to the second metal land on a reverse surface of the printed wiring board so as to cover the plurality of via holes;
   applying a solder paste over the first land on an obverse surface of the printed wiring board so as to cover the plurality of via holes;
   mounting a circuit package over the solder paste over the first metal land on the obverse surface of the printed wiring board, the circuit package including a metal slug integrally formed with the circuit package and including a heat dissipating circuit eutectically bonding the heat dissipating circuit to the metal slug; and
   heating the printed wiring board with mounted circuit package in a reflow solder oven so as to form a bonding solder film between the metal slug and the first land and so as to form a plurality of solder posts in the plurality of via holes bonded to and thermally coupling the first metal land to the second metal land.

6. The method of claim 5, further comprising steps of:
   removing the tape;
   applying a thermally conductive grease to the second metal land;
   assembling the printed wiring board in a metal case; and
   installing a fastener through the printed wiring board, through the first and second metal lands and into the metal case so as to squeeze the thermally conductive grease between the second metal land and the metal case.

7. The method of claim 1, wherein the solder body includes a solder film, the method comprising a further step of conducting heat from the metal slug through the solder film to another metal land clad to an obverse surface of the substrate.

8. The method of claim 7, further comprising a step of conducting heat from the metal land on the reverse surface of the substrate through a thermal greese film into a metal case.

9. The method of claim 7, further comprising a step of conducting heat from said another metal land on the obverse surface of the substrate through a fastener film into a metal case.

10. The method of claim 9, further comprising a step of conducting heat from the metal land on the reverse surface of the substrate through a thermal greese film into the metal case.

11. The method of claim 1, wherein the solder body includes a solder film, the method comprising further steps of:

conducting heat from the metal slug through the solder film to another metal land clad to an obverse surface of the substrate; and conducting heat from the metal slug through at least one solder post directly into the metal land on the reverse surface of the substrate.

12. The method of claim 11, further comprising a step of conducting heat from the metal land on the reverse surface of the substrate through a thermal greese film into a metal case.

13. The method of claim 11, further comprising a step of conducting heat from said another metal land on the obverse surface of the substrate through a fastener film into a metal case.

14. The method of claim 13, further comprising a step of conducting heat from the metal land on the reverse surface of the substrate through a thermal greese film into the metal case.

15. A method of transferring heat from a heat dissipating circuit comprising steps of:

conducting heat from the heat dissipating circuit to a metal slug through a eutectic bond;

conducting heat from the metal slug through a solder body having a plurality of solder posts disposed in a corresponding plurality of via holes through a substrate; and conducting heat from at least one of the solder posts into a metal land clad to a reverse surface of the substrate.

16. The method of claim 15, further comprising a step of conducting heat from the metal land on the reverse surface of the substrate through a thermal greese film into a metal case.

17. The method of claim 15, wherein a plurality metal sleeves integrally formed the metal land are disposed in the plurality of via holes, the method further comprising steps of:

conducting heat from at least one of the solder posts into corresponding ones of the plurality of metal sleeves; and conducting heat from the corresponding metal sleeves into the metal land.

18. The method of claim 17, further comprising a step of conducting heat from the metal land on the reverse surface of the substrate through a thermal greese film into a metal case.

19. The method of claim 15, wherein the solder body includes a solder film, the method comprising a further step of conducting heat from the metal slug through the solder film to another metal land clad to an obverse surface of the substrate.

20. The method of claim 19, further comprising a step of conducting heat from the metal land on the reverse surface of the substrate through a thermal greese film into a metal case.

21. The method of claim 19, further comprising a step of conducting heat from said another metal land on the obverse surface of the substrate through a fastener film into a metal case.

22. The method of claim 19, further comprising a step of conducting heat from the metal land on the reverse surface of the substrate through a thermal greese film into the metal case.

* * * * *